United States Patent [19]

Lee et al.

[11] Patent Number: 5,029,171
[45] Date of Patent: Jul. 2, 1991

[54] TEST VECTOR GENERATION SYSTEM

[75] Inventors: Gene W. Lee, Huntington Beach; George D. Underwood, Inglewood, both of Calif.

[73] Assignee: Hughes Aircraft Company, Los Angeles, Calif.

[21] Appl. No.: 356,493

[22] Filed: May 25, 1989

[51] Int. Cl.$^5$ .............................................. G01R 31/28
[52] U.S. Cl. ..................................... 371/27; 371/15.1
[58] Field of Search ...................... 371/27, 15.1, 22.1, 371/25.1

[56] References Cited

U.S. PATENT DOCUMENTS

| | | | |
|---|---|---|---|
| 4,639,919 | 1/1987 | Chang et al. | 371/27 |
| 4,688,223 | 8/1987 | Motika et al. | 371/27 |
| 4,718,065 | 1/1988 | Boyle et al. | 371/27 |
| 4,755,969 | 7/1988 | Pappas | 365/189 |
| 4,771,429 | 9/1988 | Davis et al. | 371/27 |
| 4,779,273 | 10/1988 | Beucler et al. | 371/27 |
| 4,862,399 | 8/1989 | Freeman | 371/27 |

Primary Examiner—Charles E. Atkinson
Attorney, Agent, or Firm—William J. Streeter; Wanda K. Denson-Low

[57] ABSTRACT

A test pattern data generator 16 may be made to create and generate all of the unique test vectors associated with it. These test vectors may have an arbitrarily selected programmable length 26(a-d) and may be generated in an arbitrarily selected programmable quantity 28(a-d). Furthermore, a unique test vector may be generated in a number of clock periods approximately equal to the number of shift registers (156, 158) contained in a scan or application interface unit 20. All these features are accomplished by initially placing a seed initialization value in the test pattern generator 16 and having the test pattern data generator cycle through a number of states, the second state of the test pattern generation being inputted to a seed register 12. The contents of the seed register 12 are used as the seed initialization value for the second test vector to be generated by the generator 16. This process is continued until all of the unique test vectors have been created. This invention also allows for test partitioning whereby the contents of the seed register 12 may be stored for a period of time and a complete test, entailing the creation and generation of a complete set of unique test vectors, may be partitioned in time, into a series of tests containing smaller numbers of these unique test vectors.

20 Claims, 5 Drawing Sheets

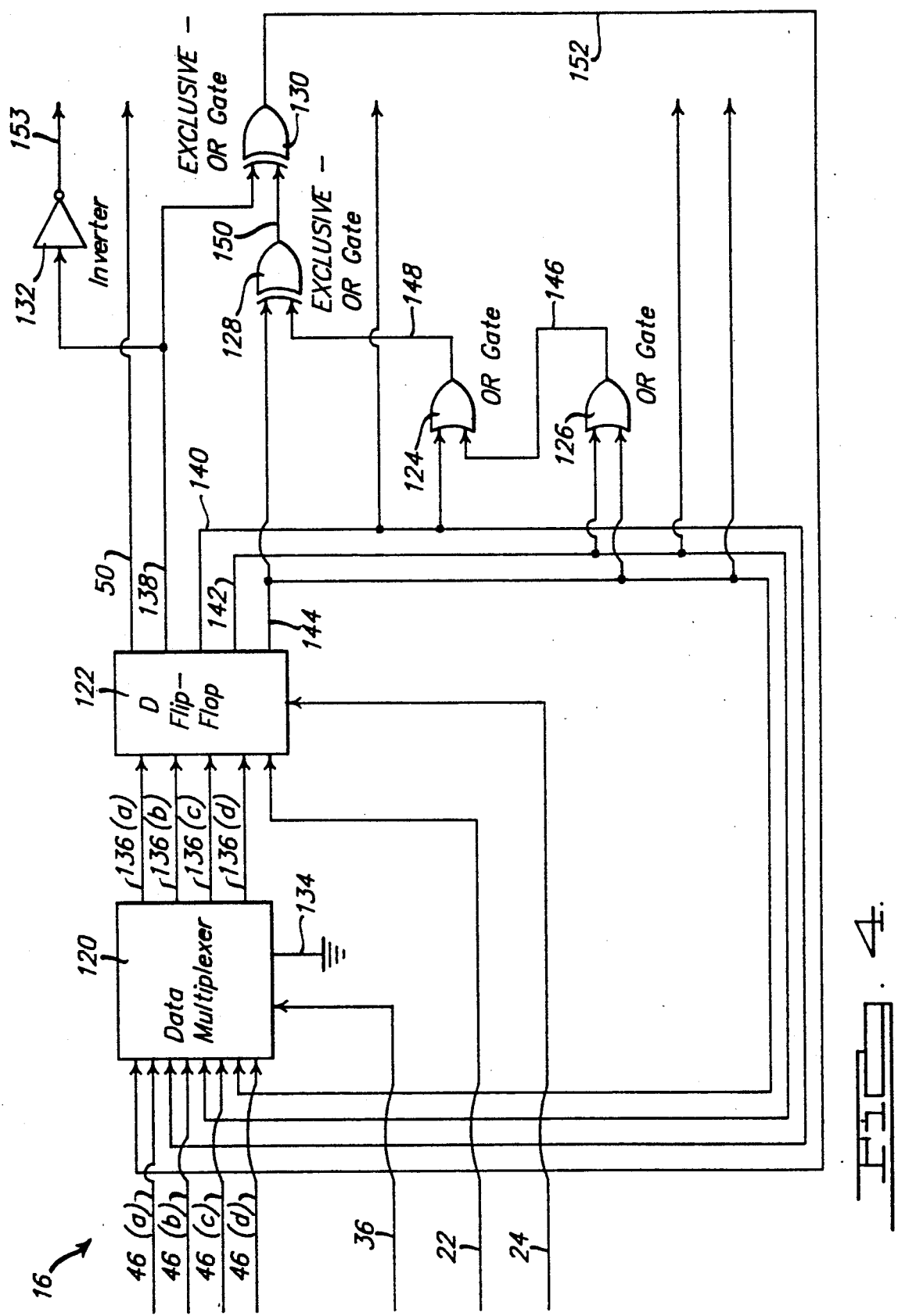

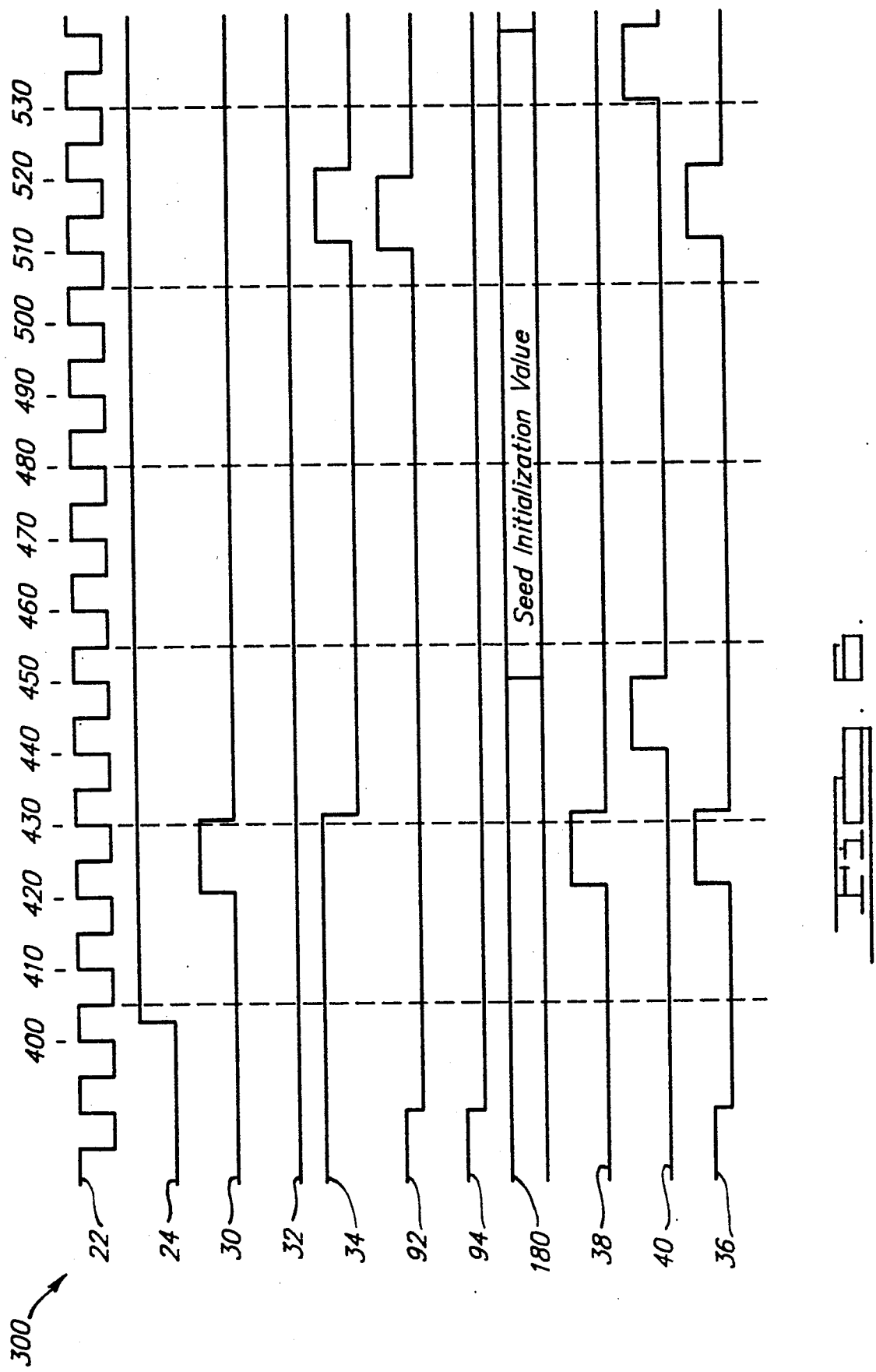

TEST VECTOR GENERATION SYSTEM

BACKGROUND OF THE INVENTION

1. Technical Field

This invention relates to test vector generation systems containing a data pattern generator. More particularly, it involves a test vector generation system that provides for the creation and generation of approximately all of the unique test vectors associated with the data pattern generator.

2. Discussion

Test vector generation systems are used in a wide variety of electronics and computer applications in order to provide for testing of computer and logic type systems. Testability is not, in general, concurrently compatible with tactical functionality. That is, if a test procedure is used on such a computer or logic system, the system must normally be placed in an inoperable state or taken out of its "normal functioning" mode. This causes this equipment to be of no use during this test interval. In order to limit this tactical dead time it generally becomes necessary to subject the computer or logic system to a less than complete test. Such testing minimizes the tactical downtime associated with the computer or logic system. However, automatic system fault isolation is often advantageous in order to minimize maintenance overhead and increase the readiness of the system. This is done by requiring a large and ideally exhaustive set of test vectors to be applied to the computer or logic system. Thus, it has become extremely important in some test applications to exhaustively test a computer or logic system. Such "dual" and "inopposite" objectives have been found to be very difficult to achieve.

Two prior approaches have generally been employed in this regard. Both of these approaches use a linear feedback type of shift register in order to generate a series of test vectors. The first approach begins the test vector generation using a default state. That is, this default state represents the state that the linear feedback shift register was in upon completion of the generation of the previous vector. This default state is used as the start initialization seed for generation of the next vector. The disadvantage of this approach is that it does not ensure that an exhaustive set of test vectors will be generated. For example, a 6 data bit long linear feedback shift register applying this technique to a 60 data bit long scan register chain, contained within an application interface unit, will typically only generate approximately 16 of the possible 64 unique test vectors. In general, the possible number of unique test vectors capable of being generated by a linear feedback shift register is approximately $2^N$ where "N" is equal to the length of bits of data of the linear feedback shift register. Usually, one such data bit is assigned to every register within the linear feedback shift register.

The second approach to generating a series of test vectors is in generating these vectors by constantly resetting the linear feedback shift register to a reset state (i.e., to a state in which all of its registers contain logical 0's). The linear feedback shift register is then cycled, or shifted one additional time than was previously done for the generation of the previous test vector. For example, if the scan register chain or application interface unit is of a length equal to 100, the first vector would be generated by cycling or shifting the linear feedback shift register approximately 100 times. The second vector would be generated by shifting 101 times after the linear feedback shift register is reset to its initial state. In general, test vector N is created and generated by having the linear feedback shift register shift a number of times equal to N+99. The disadvantage of this approach is that it introduces a latency penalty associated with shifting the correct start initialization seed into the linear feedback shift register prior to generating a test vector. In this particular example for instance, if one wished to do exhaustive testing using a 16 data bit long linear feedback shift register, the test would take approximately three hundred and twenty nine times as long as it would have taken if the aforementioned latency were not introduced. Clearly, improvements in both of these methods need to be made.

SUMMARY OF THE INVENTION

According to the teachings of the present invention, a complete set of unique test vectors may be generated by test data generator such as a linear feedback shift register. The generation of these test vectors may be partitioned in time in order to minimize periods of system inoperability while at the same time providing for exhaustive and complete system testing. The system allows for these test vectors to have an arbitrarily selected and programmed length and to be generated in quantities that are arbitrarily selected and programmed. Additionally, the test vector generation system made in accordance with the teachings of this invention allow for a test vector to be generated within a number of clock periods approximately equal to the number of registers associated with a scan register chain contained within an application interface unit. This application interface unit connects the logic or computer system to be tested to the vector generation system.

In a preferred embodiment, these features are accomplished by first placing an initialization seed value within a linear feedback shift register. The linear feedback shift register is then cycled through a number of states equal to the number of bits associated with the first test vector that it is generating. In this generation sequence, the second state of the linear feedback shift register is placed and stored into a seed register. Upon the generation and creation of this first test vector, the seed register contents are loaded into the linear feedback shift register. These contents serve as the initialization seed value associated with the next or second test vector. According to the teachings of the present invention, the quantity of test vectors and their associated lengths may be arbitrarily selected and programmed. Since the initialization seed values are stored within the seed register, the complete test associated with the creation and generation of these test vectors may be partitioned in time. This is done by simply allowing the seed register to store these initialization values and then forcing these values to be used by the linear feedback shift register at some later point in time. Thus, the generation of test vectors may start exactly where the previous generation has ended.

BRIEF DESCRIPTION OF THE DRAWINGS

Various advantages of the present invention will become apparent to those skilled in the art by reading the following specifications and by reference to the drawings which:

FIG. 4 is a diagram of a linear feedback shift register made in accordance of the teachings of the preferred embodiment of this invention;

FIG. 6 is a timing diagram associated with the electronic signals of the test vector generation system shown in FIG. 1.

DETAILED DESCRIPTION OF THE PREFERRED EMBODIMENT

Figure 1:
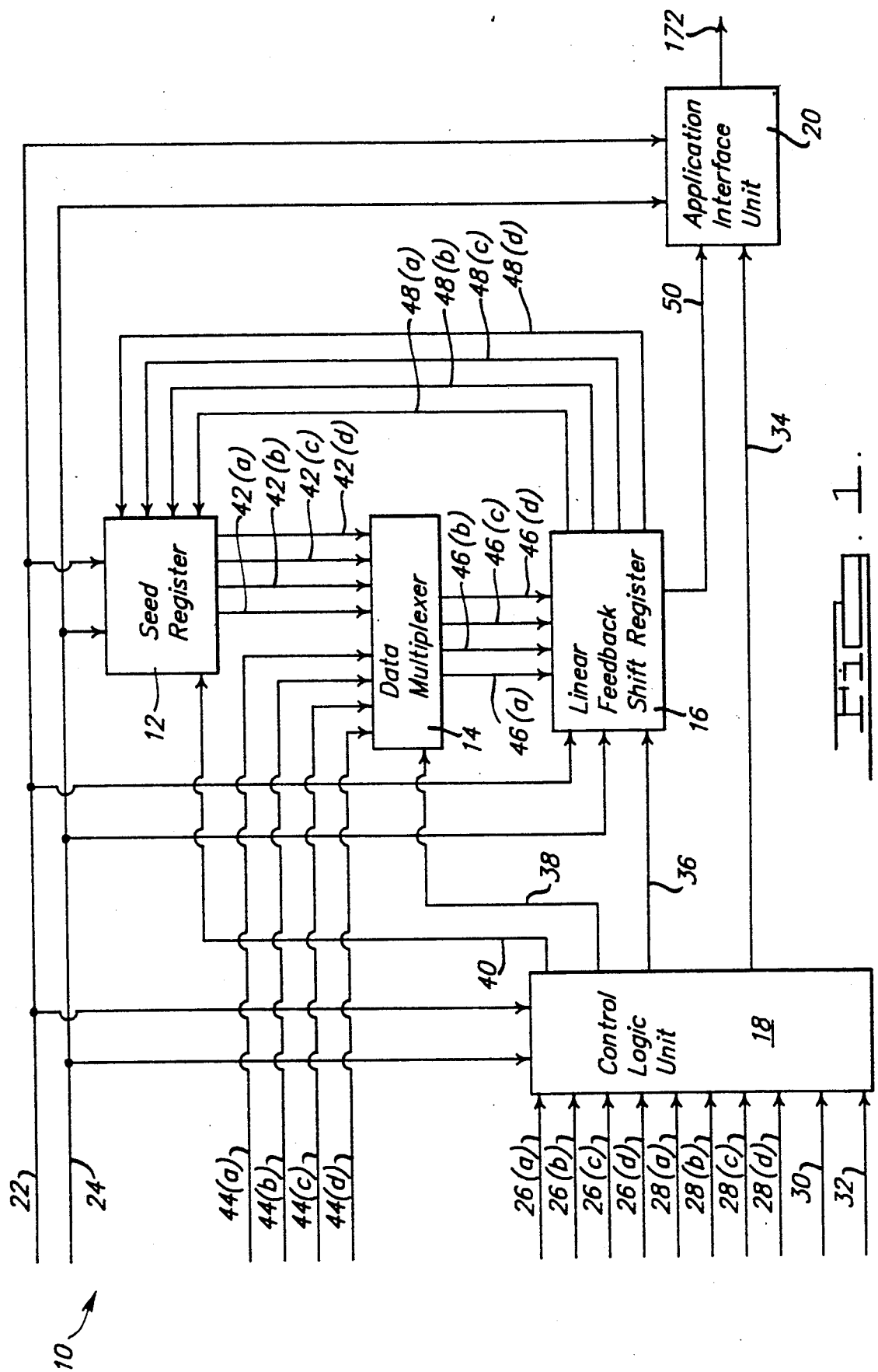
FIG. 1 is a diagram of a test vector generation system made in accordance of the teachings of the preferred embodiment of this invention.

Turning now to FIG. 1, a test vector generation system 10 is shown. The test vector generation system 10 provides for the creation and generation of approximately all of the unique test vectors associated with a linear feedback shift register 16.

Specifically, the test vector generation system 10 contains a seed register 12, a data multiplexer 14, a linear feedback shift register 16, a control logic unit 18, and an application interface unit 20. Clock signal on line 22 is connected to all of the aforementioned elements of the lookahead test generation system 10, except multiplexer 14, and provides for the general control of data flow between these elements. Reset signal on line 24 also is connected to the same units of system 10 as is clock signal on line 22 and provides for the general reset, or the placing of these units into a predetermined known state. Seed register 12 contains seed initialization values associated with the generation of test vectors by the linear feedback shift register 16. The control logic unit 18 controls the length and quantity of the test vectors generated by linear feedback shift register 16 and also controls the general operation of the linear feedback shift register 16, multiplexer 14, seed register 12, and application interface unit 20. The application interface unit 20 delivers the test vector, generated by the linear feedback shift register 16, to the system under test by means of a scan register chain.

Signals on lines 26(a-d) represents a plurality of signals which define the length of the individual test vectors to be generated by linear feedback shift register 16 and is input to control logic 18. Signals on lines 28(a-d) are input to control logic unit 18 and represents the quantity of test vecotrs that are to be generated by linear feedback shift register 16. Signals on lines 26(a-d) and 28(a-d) may be arbitrarily selected. Additionally, signals on lines 30 and 32 are also input into the control logic unit 18. The signal on line 30 represents the start test signal and causes the generation of test vectors to begin by the linear feedback shift register 16. An appropriate signal on line 32 causes the linear feedback shift register 16 to be downloaded with either a seed vector initialization value from the seed register 12 or to choose an initialization value represented by a signal on lines 44(a-d).

Control logic element 18 has four output signals (on lines 34, 36, 38, and 40) associated with it. These signals are used to control elements 20, 16, 14, and 12 respectively. Specifically, the signal on line 34 causes the application interface unit 20 to either receive data from the linear feedback shift register 16 (i.e. through a signal on line 50 which represents test vector data) or data from the logic system under test representing test results. These test results are subsequently output from system 10 through a signal on line 172. A signal on line 36 causes the linear feedback shift register 16 to either accept a new vector initialization value by signals 46(a-d) or to cycle through test vector generation states thereby producing a signal on line 50. Signal on line 38 causes the data multiplexer element 14 to place an output on signal lines 46(a-d). This output is selected to be either the output signal of seed register 12 (that is the signal on lines 42(a-d)) or the initial seed initialization value associated with the first test vector to be generated by the linear feedback shift register 16 (i.e. signal on lines 44(a-d)). The signal on lines 46(a-d) are used as a vector initialization seed by the linear feedback shift register 16. Specifically, multiplexer element 14 causes output signal on lines 46(a-d) to be substantially equal to the signal on lines 42(a-d) or the signal on lines 44(a-d). Signal on line 40 causes the seed register 12 to either continue to store its current seed initialization value or to replace it by the value represented by signal on lines 48(a-d). This control allows for test partitioning whereby seed initialization values are stored within seed register 12.

The linear feedback shift register outputs signals on lines 48(a-d) and 50 when creating and generating the test vectors. Signal on lines 48(a-d) represents the second state that the linear feedback shift register 16 traverses when generating a particular test vector. This second state is input into the seed register 12 so that it may be placed back into the linear feedback register 16 as the test vector seed initialization value associated with the next sequential test vector to be generated. Signal on line 50 represents data associated with the generation of the test vectors. Signal on line 50 is input into the application interface 20, which will transfer each test vector to a logic system under test and will capture or receive the test results.

Turning now to actual system 10 operation, reset signal on line 24 initially places seed register 12, linear feedback shift register 16, control logic element 18, and the application interface unit 20 into a known or predetermined state. This state is usually that of a logical null or zero. A seed initialization value associated with the first test vector is input by signal on lines 44(a-d) into the multiplexing unit 14. At the start of system operation, the seed register 12 contains a default "next state" value. Signal on lines 42(a-d) may optionally be output to the data multiplexer unit 14. Signal on line 38 causes signal on lines 46(a-d) to be substantially equal to signal on lines 44(a-d). Signal on lines 44(a-d) are thereby input into the linear feedback shift register 16 as the initial seed initialization value. The linear feedback shift register 16 cycles through a number of states, and in generating this first test vector, outputs a single data bit for each of the states that it cycles through. This single data bit is represented as signal on line 50 and is input into the application interface unit 20. As the linear feedback shift register 16 passes through the second state, it also outputs its contents into seed register 12 through signal on lines 48(a-d). A state of the linear feedback shift register 16 is simply defined by the contents of data contained therein. Signal on line 40 directs seed register 12 to accept these contents represented by signals on lines 48(a-d). Seed register 12 continually provides input signal on lines 42(a-d) to multiplexer 46. Seed register 12 will store the contents of the second state of the linear feedback shift register 16. The first test vector is completely generated when the scan registers of the application interface unit 20 has become filled with data from the linear feedback shift register 16. At that time, the entire test vector is input to the logic system to be tested. Seed register 12 then inputs the second state of the linear feedback shift register 16 (which it has stored), associated with the generation of the first test vector, to the multiplexing unit 14 by signal on lines 42(a-d). Multiplexing unit 14 outputs signal on lines 46(a-d) to linear feedback shift register 16. Signal on lines 46(a-d) is caused to be substantially equal to signal on lines 42(a-d) by signal 38, which is coupled to the data multiplexing unit 14 by the control logic circuit 18. Signal on lines 46(a-d) becomes the seed initialization value association with the second test vector. This process is continued until either all of the unique test vectors have been created and generated by the linear feedback shift register 16 or until the vector quantity specified by signal on lines 28 (a-d) has been obtained. Each of the test vectors generated by the linear feedback shift register 16 have predetermined lengths associated with them which are substantially equal to signal on lines 26(a-d). The control logic element 18, seed register 12, linear feedback shift register 16, and application interface unit 20 will now be explained in greater detail.

Figure 2:
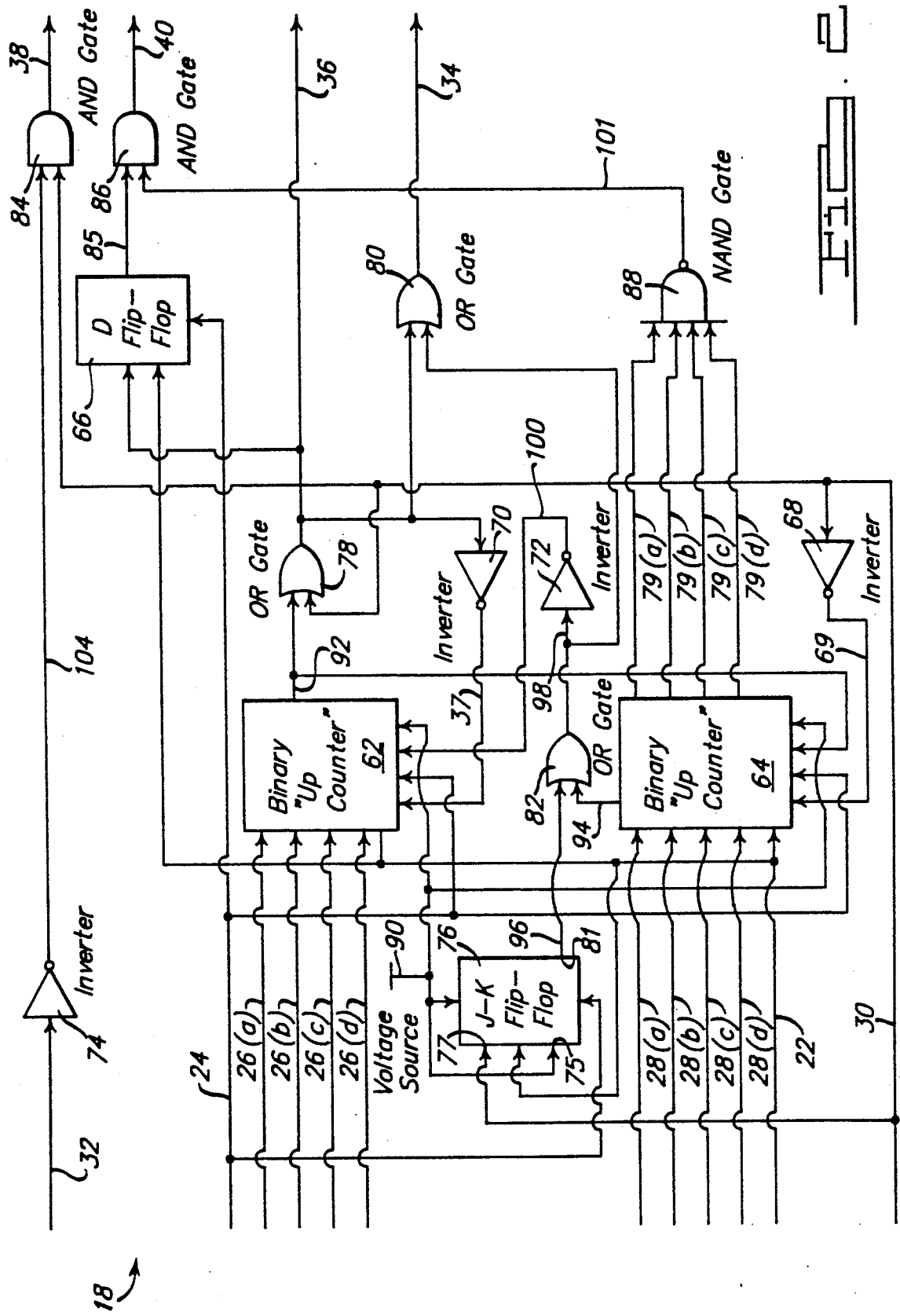
FIG. 2 is a diagram of a control logic unit made in accordance of the teachings of the preferred embodiment of this invention.

Turning now to FIG. 2, the control logic unit 18 is shown. Specifically, control logic unit 18 contains two four bit binary "up counters" 62 and 64, one quad D flip-flop 66, four inverters 68, 70, 72 and 74, a J-K positive edge-triggered flip-flop 76, three OR gates 78-82, two AND gates 84 and 86, and one NAND gate 88. Reset signal on line 24 is connected to counters 62, 64 and to flip-flops 66, 76; and causes these elements to be initially placed in a logically null or zero initial state. Clock signal on line 22 is also connected to these elements 62, 64, 66, and 76, so as to generally control the flow of data between them. Signal on line 90 represents a voltage power source and is input to flip-flop 76 and to both of the binary counters 62 and 64. Voltage signal on line 90 configures the aforementioned units to the desired mode of operation. Test vector string length programming signal on lines 26(a-d) is applied to binary counter 62. This signal specifies the initial state from which the binary counter 62 will count on its way to terminal count (TC) which is the highest counting state that the counter may reach. When this upper limit has been reached, representing the length desired of a test vector, output signal on line 92 generated. Similarly, the vector quantity programming signal on lines 28(a-d) is input into binary counter 64. This vector quantity signal on lines 28(a-d) represents an initial state from which the binary counter 64 will count on its way to terminal count (TC) which is the highest counting state that the counter may reach. When this upper limit has been reached, output signal on line 94 will be generated.

Signal on line 92 is input into OR gate 78 along with signal on line 30. The output of OR gate 78 represents signal on line 36 which causes linear feedback shift register 16 to accept a new seed initialization value (i.e. signal on lines 46(a-d)). That is, whenever signal on line 92 is logically high indicating that a test vector of a given length has been generated or when signal on line 30 is logically high indicating that the test should start, an appropriate signal on line 36 is sent to the linear feedback shift register 16 forcing it to accept a new seed initialization value (i.e. represented by signal on line 46(a-d)). This is done in a parallel fashion. Signal on line 92 is also input into binary counter 64 in order for counter 64 to increment due to the generation of a test vector.

Output signal on line 94 is input into OR gate 82 along with output signal on line 96 from flip-flop 76. Flip-flop 76 has signal on line 30 connected to its "J" input 77 and has its "K̄" input 75 set at a logically high level by being connected to signal on line 90. Output signal on line 96 is connected to the "Q̄" output 81 and accordingly, signal on line 96 will only be placed at a logically high level when a reset command is input from signal on line 24. Signal on line 30 will not force signal on line 96 to be at a logically high level. This is done in order to cause signal on line 34 to be at a logically high level only upon reset command 24. Thusly, the test vector generation system 10 will not reset into a test mode but rather into a normal operating mode.

The output signal of OR gate 82, that is signal on line 98, is input into inverter 72 and OR gate 80. Inverter 72 logically complements signal on line 98 and provides input signal on line 100 into binary counter 62. Signal on line 100 stops binary counter 62 from counting when a specified quantity of test vectors has been created and generated by the linear feedback shift register 16. This quantity specification was previously defined by signal on lines 28(a-d). Signal on line 36 is also input to OR gate 80. Gate 80 produces output signal on line 34 which is input to the application interface circuit 20. As one may recall, output signal on line 34 forces the application interface unit 20 to receive data from linear feedback shift register 16 (test mode) or to receive data from the logic system under test (normal mode). Signal on line 34 will only be logically high (normal mode) when either the quantity of vectors specified by vector quantity programming signal on lines 28(a-d) has been reached, the length of an individual test vector association with test vector quantity signal on lines 26(a-d) has been reached, or a system 10 reset has been specified by signal on line 24. Signal on line 36 is also input to inverter 70 which produces output signal on line 37 which is a logical compliment of signal on line 36. Signal on line 37 is input to counter 62 and causes the counter 62 to receive a new string length value associated with signal on lines 26(a-d) after a vector of a given length, specified by the previous value of signal on lines 26(a-d), has been generated.

Signal on line 32 is input into inverter 74 which produces output signal on line 104. Signal on line 104 represents a logical compliment of input signal on line 32 and is input into AND gate 84. Gate 84 logically combines signal on line 30 with signal on line 104 to produce signal on line 38. Signal on line 38 will direct the data multiplexer unit 14 to make output signal on lines 46(a-d) substantially equal to signal on lines 42(a-d) or on lines 44(a-d). That is, if signal on line 38 is logically low the multiplexer 14 couples signal on lines 42(a-d) to linear feedback shift register 16. Signal on line 30 is also input to inverter 68 which performs a logical complementation of signal on line 30 thereby outputting signal on line 69. Signal on line 69 is input into counter 64 and causes loading of the initial vector quantity count state, in accordance with signal on lines 28(a-d), only upon the start of a test. Counter 64 also produces output signal on lines 79(a-d) which represents the state of counter 64. Signal on lines 79(a-d) is input into NAND gate 88 which produces output signal on line 101. Signal on line 36 is input into quad "D" flip-flop 66 which produces output signal on line 85. Signal on line 85 is substantially equal to signal on line 36. Both signals on lines 85 and 101 are input into AND gate 86 which produces signal on line 40. Signal on line 40, accordingly, will direct the seed register 12 to update its contents to the value of signal on lines 48(a–d). Flip-flop 66 is used to delay signal on line 40 from directing seed register 12 to update its contents until the linear feedback shift register 16 is in the correct state (e.g. has the next seed value as its contents).

Figure 3:
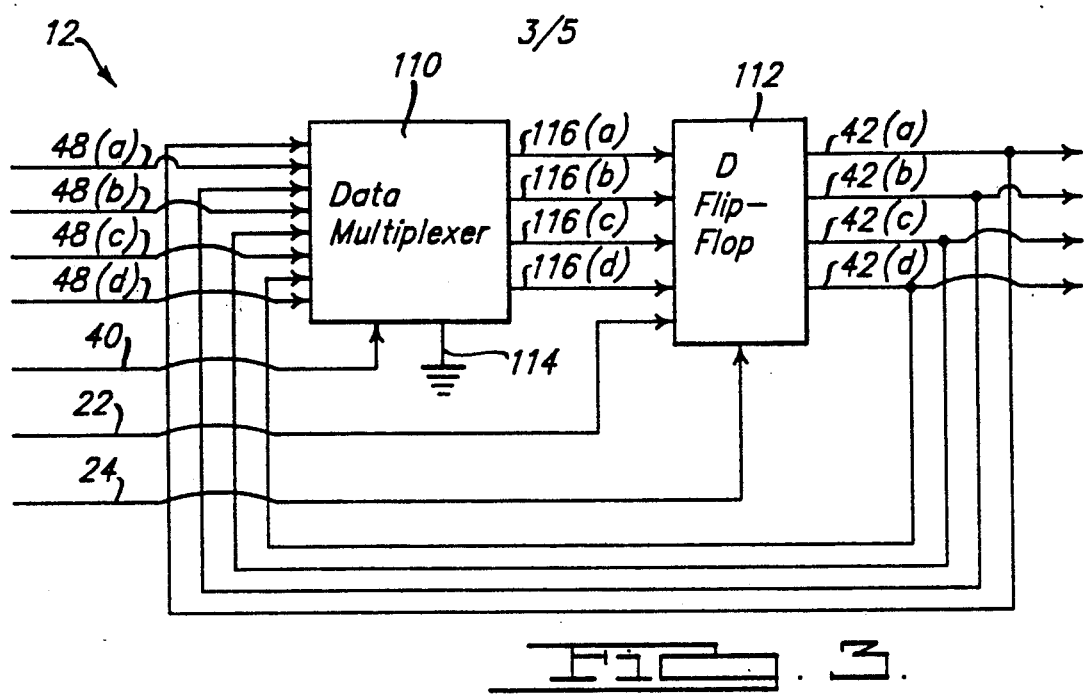
FIG. 3 is a diagram of a seed register made in accordance of the teachings of the preferred embodiment of this invention.

Turning to FIG. 3, seed register 12 is shown as containing a quad 2-input data multiplexer 110 and a quad D flip-flop 112. Signal on lines 48(a–d) is input into multiplexer 110 from linear feedback shift register 16. Signal on line 114 connects data multiplexer 110 to electrical ground thusly enabling multiplexer 110. Signal on line 40 is input into data multiplexer 110 from the control logic unit 18 as previously specified. Signal on lines 116(a–d) is output from data multiplexer 110 to flip-flop 112. Signal on lines 116 (a–d) is made to be substantially equal to signal on lines 48 (a–d) or to signal on lines 42(a–d). D flip-flop 112 is also connected to clock signal on line 22 and reset signal on line 24. Clock signal on line 22 controls the information flow associated with flip-flop 112. Reset signal on line 24 resets flip-flop 112 to a predetermined state which is defined to be a logical zero. Flip-flop 112 produces output signal on lines 42(a–d) which is input into the data multiplexer 14 and also input back into the data multiplexer 110. This feedback allows for the continued storage of seed register data which provides for test partitioning.

Turning now to FIG. 4, a typical linear feedback shift register 16 is shown as containing a quad two input multiplexer 120, a quad D flip-flop 122; OR gates 124 and 126; EXCLUSIVE-OR gates 128 and 130; and an inverter 132. Signal on line 134 connects data multiplexer 120 to electrical ground thusly enabling multiplexer 120. Clock signal 22 is connected to flip-flop 122 and generally controls the flow of data associated therewith. Reset signal on line 24 is input to flip-flop 122 and forces flip-flop to a known initial state (e.g. to a logical zero or null). Signal on lines 46(a–d), representing a seed initialization value, is output from multiplexer 14 and input into multiplexer 120. Signal on line 36 is output from the control logic unit 18 and also input into multiplexer 120. Signal on line 36 directs multiplexer 120 to receive signal on lines 46(a–d) when signal on line 36 is at a logical high state. Signal on lines 136(a–d) is output from multiplexer 120 to flip-flop 122 and is made to be substantially equal to signal on lines 46(a–d). Flip-flop 122 produces output signal on line 50 which represents the test vector generation data. Flip-flop 122 also produces output signals on lines 138, 140, 142 and 144. Signals on lines 142 and 144 are input to OR gate 126 and fed back to multiplexer 120. OR gate 126 produces signal on line 146 which is input into OR gate 124. Signal on line 140 is also input into OR gate 124 and fed back to multiplexer 120. OR gate 124 produces output signal on line 148 which is input, along with signal on line 144 (which is also fed into multiplexer 120), into Exclusive OR gate 128. Exclusive OR gate 128 produces output signal on line 150 which is input, along with signal on line 138 into exclusive OR gate 130. Exclusive OR gate 130 produces signal on line 152 which is input into data multiplexer 120. Signal on line 138 is input into inverter 132 which takes the logical complement of signal on line 138 and produces output signal on line 153. Signals on lines 153, 140, 142, and 144 represent a state of the linear feedback shift register 16 at any point in time. Signal on line 50 represents the serial output, by the linear feedback shift register 16, of single bits of data to the application interface unit 20. An individual test vector, identified by a given string length is thereby constructed, a single data bit at a time, within application interface unit 20. The feedback of signals on lines 140, 142, and 144 from flip-flop 122; and signal on line 152 from Exclusive OR gate 130 to multiplexer 120 allows the linear feedback shift register 16 to cycle through all of its unique states.

Figure 5:
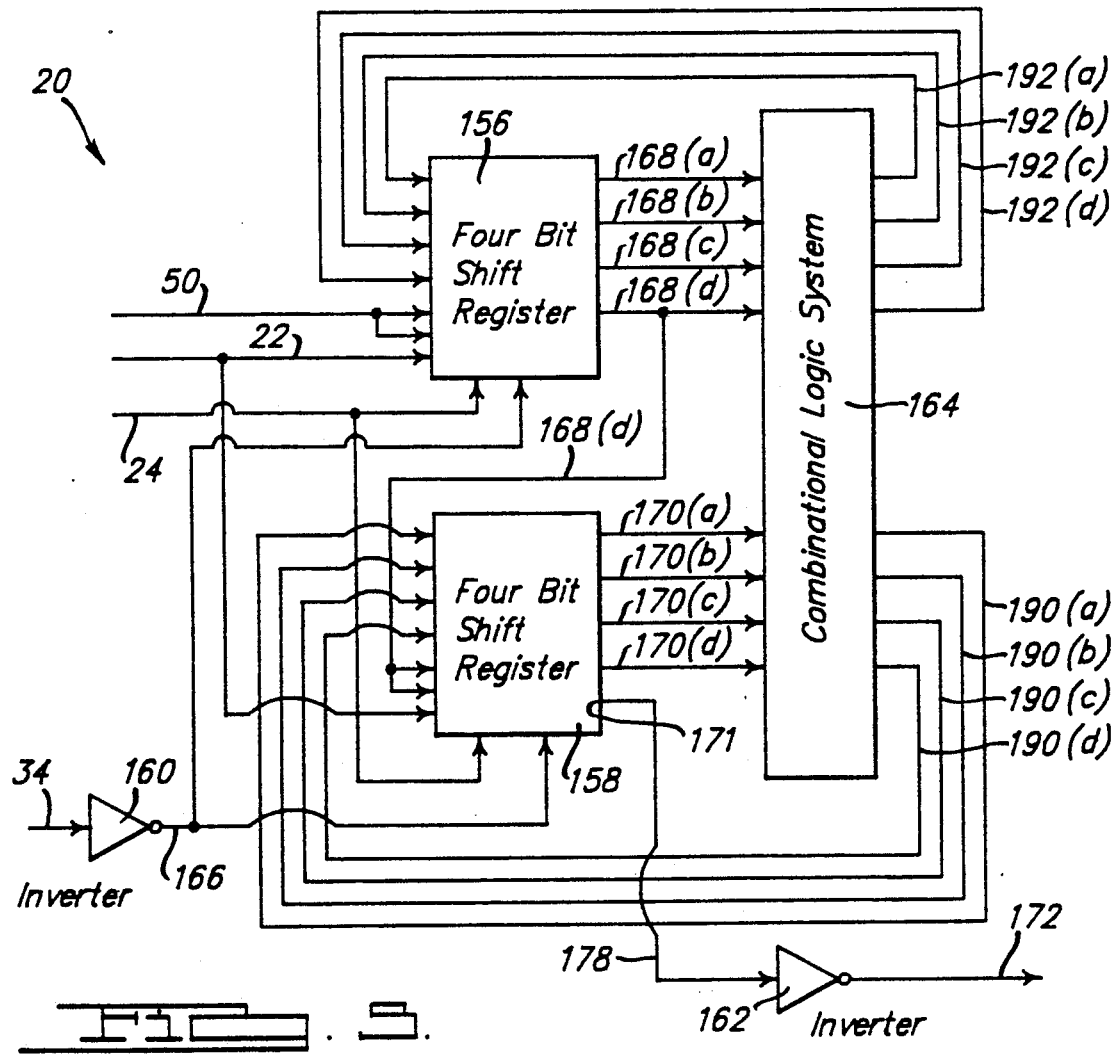
FIG. 5 is a diagram of an application interface unit made in accordance of the teachings of the preferred embodiment of this invention.

Turning now to FIG. 5, the application interface unit 20 is shown as containing two four bit shift registers 156, 158 and two inverters 160 and 162. The logic system under test consists of shift registers 156 and 158 and the associated combinational logic 164. Shift registers 156 and 158 (i.e. the scan registers) are connected to reset signal on line 24 which forces these registers 156, 158 to a known and predetermined state (i.e. logical zero or null). Clock signal on line 22 also is connected to registers 156 and 158 to control the flow of data associated therewith. Signal on line 34, from the control logic element 18, is input into inverter 160. Inverter 160 performs a logical complement operation upon signal on line 34 and produces output signal on line 166 which is input into register 156 and 158 so that when signal on line 34 is logically high, registers 156 and 158 are directed to receive data, in a parallel fashion, from the combinational logic system 164. When signal on line 34 is logically low, registers 156 and 158 form a register scan chain into which test vector data is input, a single bit at a time from signal on line 50. Registers 156, 158 are connected together through signal on line 168(d) thereby forming a serial scan register chain. Transfer signal on line 168(d) allows registers 156 and 158 to act as a single eight bit serial sequential data logic register. Register 156 has outputs signals on lines 168(a–d). Signals on lines 168(a–d) are input into the combinational logic system 164. Register 158 also has output signal on lines 170(a–d) directed to combinational logic system 164. Signals on lines 168(a–d) and 170(a–d) allow test vector data to be transferred to system 164 in parallel fashion. Combinational logic system 164 generates parallel signals on lines 190(a–d) and 192(a–d) to registers 158 and 156 respectively. These signals represent the output of system 164 due to test signal inputs on lines 168(a–d) and 170(a–d). This data may be analyzed to define possible system 164 faults. Signal on line 178 is output from the "$\overline{Q3}$" output port 171 of register 158. Signal on line 178 is input to inverter 162 and signal on line 172 is produced which is a logical complement of signal on line 178. Signal on line 172 represents, in serial fashion, signals on lines 190(a–d) and 192(a–d) after they have been loaded into registers 156 and 158. That is, the data associated with signals on lines 190(a–d) and 192(a–d), held within registers 156 and 158, is output (from these registers 156, 158) one data bit at a time as new test vector data associated with signal on line 50 is serially input into registers 156, 158.

Many of the aforementioned elements of the preferred embodiment of test vector generation system 10 may be commercially obtained as follows:

| Element of System 10 | Signetic Corporation's Corresponding Part Number |
|---|---|
| 74, 70, 72, 68, 132, 160, 162 | 74F04 |
| 84, 86 | 74F08 |
| 88 | 74F10 |
| 78, 80, 82, 124, 126 | 74F32 |
| 130, 128 | 74F86 |
| 76 | 74F109 |
| 110, 120 | 74F157 |
| 62, 64 | 74F163A |
| 112, 66, 122 | 74F175 |
| 156, 158 | 74F195 |

Turning now to FIG. 6, a timing diagram 300 of many of the signals associated with the operation of the test vector generation system 10 are shown. Clock signal on line 22 represents a plurality of pulses, each pulse representing a discrete point of time. As stated earlier, clock signal on line 22 generally controls the flow of data associated with test vector generation system 10. In this system 10, each of the control signals on lines (30, 32, 34, 36, 38, 40, 92, and 94) are activated on the rising edge of a clock signal on line 22. The effect of these control signals is accomplished during the next pulse of clock signal on line 22 after which they were received by system 10. Additionally, the system 10's scan register chain has been seen to comprise registers 156 and 158. Since, in the preferred embodiment, each of these registers 156, 158 contains four data registers each, the total scan length of system 10 is defined to be eight. Each of these aforementioned signals function by changing its logical state. Also for this analysis, an assumption is made that the string length specified by signal on lines 26(a-d) is eight bits and that signal on lines 28(a-d) specifies a vector quantity of 10 for the first partition. That is, the first partition will contain only ten test vectors. Prior to time 400 (initial time) reset signal on line 24 is low, thereby causing seed register 12, linear feedback shift register 16, control logic element 18, and the application interface unit 20 registers 156 and 158 to be forced to a logical zero state.

At time 420, signal on line 30 changes state which indicates to the control logic element 18 that the test is to begin. Signal on line 32 remains in a logically low state through time 420 indicating to the control logic element 18 that output signal on line 38 should be generated which will cause multiplexer 14 to force output signal on lines 46(a-d) to be substantially equal to signal on lines 44(a-d). This is shown in diagram 300 where signal on line 38 changes state at time 420. Signal on line 34 must now force the application interface unit 20 to begin accepting test vector data from the linear shift register 16. This test data is represented by signal on line 50. Diagram 300 shows signal on line 34 changing state at time 430. Thusly, application interface unit 20 will be ready to receive test signal on line 50 at time 440. Signals on lines 92 and 94 are low at the initial time of 400 as they represent the output of binary counters 62 and 64 respectively. Signal on line 180 represents the contents of seed register 12 and is substantially equivalent to signals as lines 42(a-d). At initial time 400, seed register 12 contents are zero or logically null. Signal on line 40 is also in a low state at initial time 400 as is signal on line 36.

During system 10 operation, linear feedback shift register 12 cycles through eight states (i.e. since we have defined a single test vector to be eight data bits long). Each state results in the output of a single bit of data to scan registers 156, 158. At approximately time 510 these registers 156, 158 are full of data received from linear feedback shift register 16. This takes eight clock periods (i.e., time 440 to time 510). Additionally, in accordance with the teachings of this invention the second state of linear feedback shift register 16 must be input to seed register 12. At time 440, signal on line 40 changes state which causes seed register 12 to accept state information from linear feedback shift register 16, represented by signal on lines 48(a-d). At time 450, diagram 300 illustrates the associated change in the contents of seed register 12 which is represented as signal on line 180. At time 520, data contained in registers 156, 158 must be input to the system under test 164. Thusly, at time 510, signal on line 34 changes state thereby forcing application interface unit 20 to transfer test vector data contained within registers 156, 158 to system 164. At time 520, system 164 inputs signals on lines 190(a-d) and 192(a-d) back to registers 158 and 156 respectively. Additionally, it should be noted that signal on line 92 is shown on diagram 300 as changing state at time 510. This state change is accomplished by counter 62 and is necessitated by the fact that an entire test vector of the length specified by signal on lines 26(a-d) has been generated at this time.

It should also be noted, in accordance with the teachings of this invention that this first unique test vector was created and generated in eight clock periods which correspond to the number of data registers contained within application interface unit 20 (i.e. registers 156 and 158 each contain four data registers). This creation and generation characteristic is equally applicable to all other unique test vectors to be created and generated by linear feedback shift register 16.

In order to begin generation of the second test vector, according to the teachings of this invention, seed register 12 must input its contents into linear feedback shift register 16. Thusly, at time 510, signal on line 36 changes state so that linear feedback shift register 16 will receive signal on lines 46(a-d) from multiplexer 14 at time 520. The second test vector generation begins in a similar manner to the first generation. Since seed register 12 is capable of storing test vector initialization values, the test may be partitioned in time. That is, our present example will yield a number of unique vectors approximately equal to ten, since a vector quantity of ten was chosen by signal 28 or 16 unique vectors may be generated. Additional partitions may be added to generate the rest of the 16 unique test vectors. To begin the second partition, control logic element 18 causes signal on line 36 to change state after receiving signal on line 30. Signal on line 36 causes the linear feedback shift register to receive the stored contents of seed register 12 (signal on lines 42(a-d) via multiplexer 14 through signal on lines 46(a-d). This is accomplished by holding signal on line 38 to a constant low state thereby forcing multiplexer 14 to make its output signal on lines 46(a-d) always substantially equal to signal on line 42(a-d). Signal on lines 42(a-d) has been seen to be output from seed register 12. Any type of partitioning scheme may be employed by the test vector generation system 10.

While the above description constitutes the preferred embodiments of the present invention, it will be appreciated that the invention is susceptible to modification, variation and change without departing from the proper scope and fair meaning of the accompanying claims.

What is claimed is:

1. A test vector generation system for generating test data to a logic system wherein said logic system contains a plurality of scan registers having an input and output, said test vector generation system comprising:
   (a) test pattern data generation means, having an input and output, for creating and generating a sequence of test vectors, each of said test vectors being created from a seed initialization value;
   (b) means for coupling said output of said test pattern data generation means to said input of said plurality of scan registers; and
   (c) control means, in communication with both said test pattern data generation means and said scan registers, for identifying and storing the seed initialization values associated with each of said test vectors whereby, substantially all of the test vectors associated with said test pattern data generation means may be created and generated.

2. A test vector generation system for generating test data to a logic system wherein said logic system contains a plurality of scan registers having an input and output, said test vector generation system comprises:
   (a) test pattern data generation means, having an input and output, for creating and generating a sequence of test vectors, each of said test vectors being created from a seed initialization value;
   (b) means for coupling said output of said test pattern data generation means to said input of said plurality of scan registers;
   (c) control means, in communication with both said test pattern data generation means and said scan registers, for identifying said seed initialization values associated with each of said test vectors and for coupling said seed initialization values to said test pattern data generation means at selected intervals of time in order to allow for test partitioning.

3. A test vector generation system of claim 1 wherein said test pattern data generation means comprises a linear feedback shift register.

4. The test vector generation system of claim 3 wherein said linear feedback shift register comprises:
   (a) data multiplexing means, having an input and output, for receiving data;
   (b) flip-flop means, having an input and output, for receiving and storing data;
   (c) first means for coupling said input of said data multiplexing means to said control means;
   (d) second means for coupling said output of said data multiplexing means to said input of said flip-flop means; and
   (e) third means for coupling said output of said flip-flop means to said control means and to said logic system to be tested.

5. A test vector generation system of claim 2 wherein said test pattern data generation means comprises a linear feedback shift register.

6. The test vector generation system of claim 5 wherein said linear feedback shift register comprises:
   (a) data multiplexing means, having an input and output, for receiving data;
   (b) flip-flop means, having an input and output, for receiving and storing data;
   (c) first means for coupling said input of said data multiplexing means to said control means;
   (d) second means for coupling said output of said data multiplexing means to said input of said flip-flop means; and
   (e) third means for coupling said output of said flip-flop means to said control means and to said logic system to be tested.

7. The test vector generation system of claim 1 wherein said control means comprises:
   (a) first binary counter means, having an input and output, for programming the length to be associated with said test vectors, said test vector length to be substantially defined by a signal coupled to said input thereof;
   (b) second binary counter means, having an input and output, for programming the quantity of said unique test vectors to be created by said test pattern data generation means, said test vector quantity to be substantially defined by a signal coupled to said input thereof;
   (c) seed register means, having an input and output, for storing said seed initialization values;
   (d) first coupling means for coupling said output of said first binary counter means to said input of said test pattern data generation means;
   (e) second coupling means for coupling said output of said second binary counter means to said input of said test pattern generation means;
   (f) third coupling means for coupling said input of said seed register means to said output of said test pattern data generation means; and
   (g) fourth coupling means for coupling said output of said seed register means to said input of said test pattern data generation means.

8. The test vector generation system of claim 7 wherein said control means further comprises means for applying a clock signal having a plurality of periods for generally controlling the flow of data within said test vector generation system, wherein each of said test vectors can be generated within a number of said clock periods approximately equal to the number of registers contained within said plurality of scan registers.

9. The test vector generation system of claim 7 wherein said fourth coupling means comprises a data multiplexer.

10. The test vector generation system of claim 2 wherein said control means comprises:
   (a) first binary counter means, having an input and output, for programming the length to be associated with said test vectors, said test vector length to be substantially defined by a signal coupled to said input thereof;
   (b) second binary counter means, having an input and output, for programming the quantity of said unique test vectors to be created by said test pattern data generation means, said test vector quantity to be substantially defined by a signal coupled to said input thereof;
   (c) seed register means, having an input and output, for storing said seed initialization values;
   (d) first coupling means for coupling said output of said first binary counter means to said input of said test pattern data generation means;
   (e) second coupling means for coupling said output of said second binary counter means to said input of said test pattern generation means;
   (f) third coupling means for coupling said input of said seed register means to said output of said test pattern data generation means; and
   (g) fourth coupling means for coupling said output of said seed register means to said input of said test pattern data generation means.

11. The test vector generation system of claim 10 wherein said control means further comprises means for applying a clock signal having a plurality of periods for generally controlling the flow of data within said test vector generation system, wherein each of said test vectors can be generated within a number of said clock periods approximately equal to the number of registers contained within said plurality of scan registers.

12. The test vector generation system of claim 10 wherein said fourth coupling means comprises a data multiplexer.

13. A method for generating substantially all of the unique test vectors associated with a test pattern data generation, said method comprising the steps of:
(a) inputting a test vector initialization seed into a seed register means, having an input and output, for storing data;
(b) inputting said test vector initialization seed, from said seed register means, into test pattern data generation means for creating and generating a sequence of test vectors, said test pattern data generation means, having an input and output, cycling through a series of states such that a single bit of data is output during each cycle and wherein, said test vector initialization seed defines the first state of said test pattern data generation means wherein said state is generally defined by the data contained within said test pattern data generation means at a given time;
(c) coupling the output of said test pattern data generation means to an input of a scan data register means for storing data said scan data register means having an output and containing a plurality of data registers;
(d) inputting the second state of said test pattern data generation means into said seed register means;
(e) coupling the output of said scan register means to a combinational logic system to be tested, said coupling being accomplished only when approximately every register of said scan register means contains data received from said test pattern data generation means and wherein said sequence of data contained within said registers of said scan register means is defined to be a single test vector; and
(f) coupling the output of said seed register means to said test pattern data generation means wherein said output is defined to be the vector initialization seed of the next test vector to be generated.

14. The method of claim 13 wherein said test vector generation occurs at selected intervals of time to allow for test partitioning.

15. The method of claim 13 wherein a clock signal having a plurality of periods controls the flow of data, and wherein a unique test vector may be generated within a number of clock periods approximately equal to the number of said registers contained within said scan register means.

16. The method of claim 13 wherein the step of inputting said test vector initialization into test pattern data generation means includes inputting into a linear feedback shift register.

17. The method of claim 16 wherein the step of inputting into the linear feedback shift register comprises:
(a) incorporating data multiplexing means for receiving data, having an input and output;
(b) incorporating flip-flop means for receiving and storing data, having an input and output;
(c) incorporating first means for coupling said input of said data multiplexing means to said output of said seed register means;
(d) incorporating second means for coupling said output of said data multiplexing means to said input of said flip-flop means; and
(e) incorporating third means for coupling said output of said flip-flop means to said input of said seed register means and to said combinational logic system to be tested.

18. A test vector generation system comprising:
(a) a linear feedback shift register means for creating and generating a sequence of test vectors wherein said test vectors are generated from an initialization seed value;
(b) scan register means, containing a plurality of data registers, for receiving and transferring data;
(c) means for applying a clock signal having a plurality of periods for generally controlling the flow of data within said test vector generation system whereby substantially all unique test vectors associated with said linear feedback shift register means may be generated within a number of said clock periods approximately equal to the number of registers contained within said scan register means;
(d) seed register means having an input and output for storing said initialization seed values; and
(e) control means for identifying said seed values.

19. The test vector generation system of claim 18 wherein said test vector generation occurs at selected intervals of time in order to allow for test partitioning.

20. The test vector generation system of claim 18 wherein said linear feedback shift register means comprises:
(a) data multiplexing means for receiving data, having an input and output;
(b) flip-flop means for receiving and storing data, having an input and output;
(c) first means for coupling said input of said data multiplexing means to said output of said seed register means;
(d) second means for coupling said output of said data multiplexing means to said input of said flip-flop means; and
(e) third means for coupling said output of said flip-flop means to said input of said seed register means and to a logic system to be tested.

* * * * *